(12) United States Patent
Siulinski et al.

(10) Patent No.: US 9,209,651 B2
(45) Date of Patent: Dec. 8, 2015

(54) VBUS POWER SWITCH

(75) Inventors: James A. Siulinski, Westbrook, ME (US); Kenneth P. Snowdon, Falmouth, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 750 days.

(21) Appl. No.: 13/114,761

(22) Filed: May 24, 2011

(65) Prior Publication Data

US 2011/0291482 A1     Dec. 1, 2011

Related U.S. Application Data

(60) Provisional application No. 61/348,484, filed on May 26, 2010.

(51) Int. Cl.
 *H02J 9/00* (2006.01)
 *H02J 9/06* (2006.01)

(52) U.S. Cl.
 CPC .............. *H02J 9/061* (2013.01); *Y10T 307/615* (2015.04)

(58) Field of Classification Search
 CPC ........................................................ H02J 9/00
 USPC .......................................................... 307/64
 See application file for complete search history.

(56) References Cited

U.S. PATENT DOCUMENTS

| 5,764,031 | A | 6/1998 | Mishima | |
|---|---|---|---|---|
| 7,352,087 | B2 * | 4/2008 | Nguyen et al. | 307/150 |
| 7,791,319 | B2 * | 9/2010 | Veselic et al. | 320/158 |
| 2007/0241618 | A1 | 10/2007 | Xu | |
| 2009/0273316 | A1 * | 11/2009 | Lee | 320/138 |
| 2010/0133908 | A1 * | 6/2010 | Weng | 307/48 |

FOREIGN PATENT DOCUMENTS

| CN | 1749925 A | 3/2006 |
|---|---|---|
| CN | 102263434 A | 11/2011 |

(Continued)

OTHER PUBLICATIONS

"Chinese Application Serial No. 201110138541.7, Office Action mailed Jan. 21, 2014", w/English Translation, 10 pgs.

(Continued)

*Primary Examiner* — Rexford Barnie
*Assistant Examiner* — Daniel Kessie
(74) *Attorney, Agent, or Firm* — Schwegman Lundberg & Woessner, P.A.

(57) ABSTRACT

This document discusses, among other things, an electronic circuit and method for defaulting to a valid battery supply to power an electronic device. In an example, an electronic circuit can be configured to receive information about the battery supply (e.g., an internal battery), such as the battery supply voltage ($V_{BAT}$), and to determine if the battery supply is valid or invalid using the received information (e.g., comparing the $V_{BAT}$ to a threshold). If $V_{BAT}$ is valid, the electronic device can default to receiving power from the battery supply. If $V_{BAT}$ is invalid, the electronic device can receive power from another power supply, such as an external supply.

10 Claims, 3 Drawing Sheets

(56) References Cited

FOREIGN PATENT DOCUMENTS

| | | |
|---|---|---|
| JP | 05236168 A | 9/1993 |
| KR | 1020110129831 A | 12/2011 |

OTHER PUBLICATIONS

"Chinese Application Serial No. 201110138541.7, Office Action mailed Jun. 19, 2014", w/English Translation, 8 pgs.

"Chinese Application Serial No. 201110138541.7, Office Action mailed Jun. 27, 2013", w/English Translation, 11 pgs.

"Chinese Application Serial No. 201110138541.7, Response filed Apr. 8, 2014 to Office Action mailed Jan. 21, 2014", w/English Claims, 13 pgs.

"Chinese Application Serial No. 201110138541.7, Response filed Nov. 12, 2013 to Office Action mailed Jun. 27, 2013", 11 pgs.

"Chinese Application Serial No. 201110138541.7, Office Action mailed Feb. 2, 2015", English Translation of Form, 9 pgs.

"Chinese Application Serial No. 201110138541.7, Request for Reexamination filed May 18, 2015", w/ English Claims, 11 pgs.

\* cited by examiner

VBUS POWER SWITCH

CLAIM OF PRIORITY

This application claims the benefit of priority under 35 U.S.C. §119(e) of Siulinski et al., U.S. Provisional Patent Application Ser. No. 61/348,484, entitled "VBUS POWER SWITCH," filed on May 26, 2010, the entirety of which is incorporated by reference herein.

BACKGROUND

Many electronic devices can be powered by more than one power supply, such as an internal battery and an external supply, such as a corded supply. Typically, when a battery supply and a corded supply are both valid and present, the corded supply is chosen to power the electronic device. In other examples, a determination can be made between the multiple supplies using one or more characteristics of the supply.

OVERVIEW

This document discusses, among other things, an electronic circuit and method for defaulting to a valid battery supply to power an electronic device. In an example, an electronic circuit can be configured to receive information about the battery supply (e.g., an internal battery), such as the battery supply voltage ($V_{BAT}$), and to determine if the battery supply is valid or invalid using the received information (e.g., comparing the $V_{BAT}$ to a threshold). If $V_{BAT}$ is valid, the electronic device can default to receiving power from the battery supply. If $V_{BAT}$ is invalid, the electronic device can receive power from another power supply, such as an external supply.

In other examples, the electronic circuit and method can include a power supply override (PSO) option configured to change the default configuration, for example, to default to the external supply instead of the battery supply.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
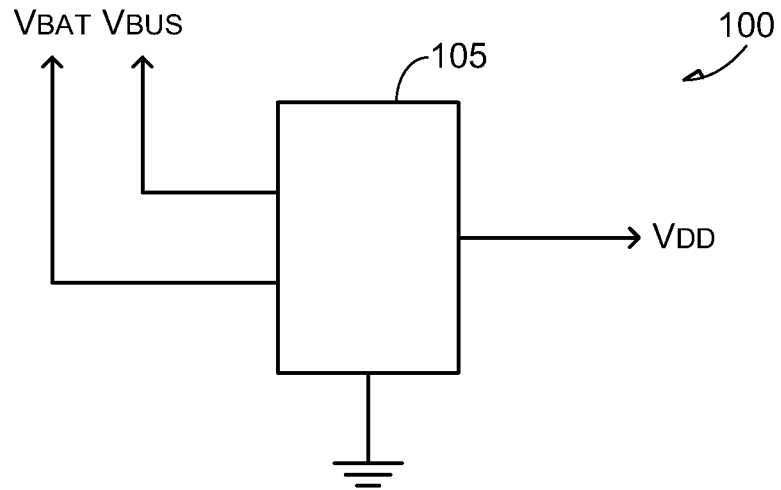
FIGS. 1-3 illustrate generally example switch circuits.

The present inventors have recognized, among other things, that in certain examples, it can be desirable to default to providing power to an electronic device using a valid battery supply instead of an external supply. In certain examples, the battery supply can be more stable or predictable, gradually falling off from a steady level, or having less abrupt changes in available power. In an example, an electronic circuit, such as a switch (e.g., a power switch), can be configured to receive power from both a battery supply and an external supply (e.g., a corded supply), to determine if the battery supply is valid or invalid (e.g., comparing a battery supply voltage ($V_{BAT}$) to a threshold), and default to providing an internal device voltage ($V_{DD}$) using power from the battery supply if the battery supply is valid. In an example, the electronic circuit can be configured to provide $V_{DD}$ using power from the external supply when the battery supply is present but invalid, or when the battery supply is not present.

In an example, the electronic circuit can automatically transition from providing $V_{DD}$ using the battery supply to providing $V_{DD}$ using the external supply, or vice versa, without interruption. In certain examples, $V_{DD}$ can be provided without interruption using the battery supply, the external supply, or a combination or series of the battery supply and the external supply. The present inventors have recognized, among other things, that the systems and methods disclosed herein can be implemented with little or no software changes or modifications to existing devices, allowing simple adoption for all customers.

In an example, the electronic circuit can be configured to receive power from a plurality of different power supplies, including a battery supply and one or more external supplies (e.g., a wall charger, an AC-to-DC converter, a USB bus voltage, or one or more other supplies). In an example, when the battery supply is not present or invalid (e.g., when $V_{BAT}$ is below a threshold) and the external supply is present, the electronic device can be configured to provide power to the electronic device using the external supply. When the battery supply is present and valid (e.g., when $V_{BAT}$ is above a threshold), the electronic circuit can automatically switch to providing power to the electronic device using the battery supply, even if the battery supply is at a lower voltage than the external supply.

In an example, the electronic circuit can include a power supply override feature configured to change the default supply, for example, from the battery supply to the external supply. In an example, the PSO can be user controlled or programmable. For example, if desired, the PSO can be used to force the electronic circuit to provide power to the electronic device using the external voltage when the battery voltage is present and valid.

In an example, the electronic circuit can be configured to allow the electronic device (e.g., a portable or mobile device, such as a communication device, a computing device, a media player, etc.) to be powered from the external supply under certain conditions where there is no internal battery or control functionality from a processor (e.g., during production test/setup where the system has not yet been programmed, etc.). In an example, once the electronic device has been programmed and normal battery power has been initialized or restored, the electronic circuit can automatically change to using the battery supply.

FIG. 1 illustrates generally an example of a system 100 including a switch 105 configured to receive power from a battery supply, to receive power from an external supply, to determine if the battery supply is valid or invalid (e.g., comparing a battery supply voltage ($V_{BAT}$) to a threshold), and default to providing an internal device voltage ($V_{DD}$) using power from the battery supply if the battery supply is valid. In an example, if the battery supply is valid, then only the battery supply is used to provide $V_{DD}$. In other examples, if the battery supply is valid, then the external supply is not used to provide $V_{DD}$.

In an example, the switch 105 can be configured to provide $V_{DD}$ using power from the external supply (e.g., an external supply voltage, such as a USB bus voltage, $V_{BUS}$), and not the battery supply, when the battery supply is present but invalid, or when the battery supply is not present.

In certain examples, the switch 105 can be included as a component of a device (e.g., a USB switch, a USB transceiver, etc.), or can be coupled to a device configured to receive power from more than one supply (e.g., a battery supply and an external supply, such as an AC-to-DC converter, a USB bus voltage, etc.). In an example, one or more condition can exist defining when one or more of the first or second voltages are used to provide the output voltage.

Figure 2:
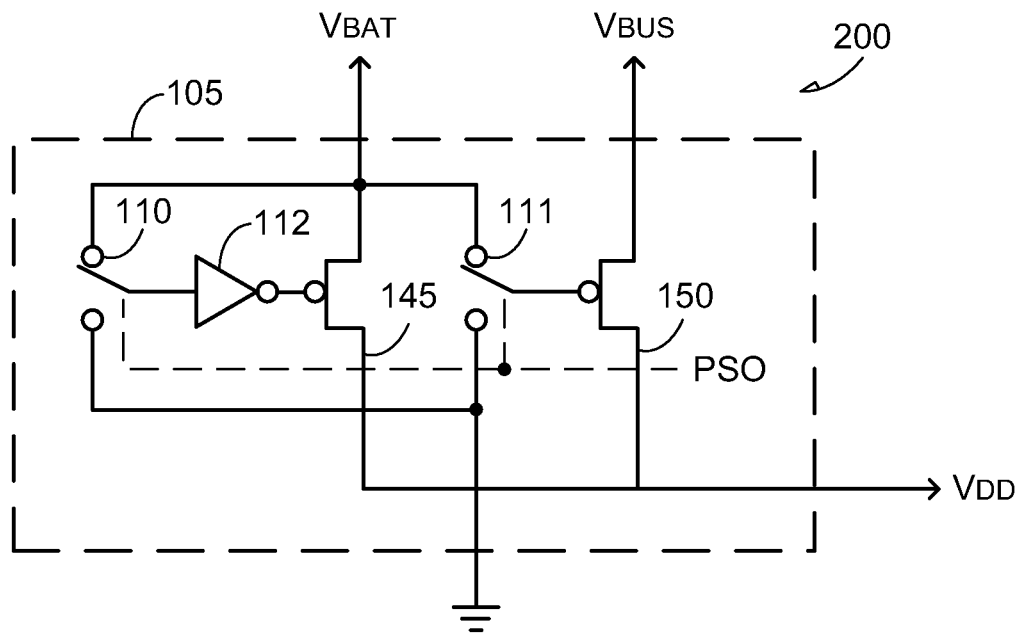

FIG. 2 illustrates generally an example of a system 200 including a switch 105 and a power supply override (PSO) option including first and second switches 110, 111 and an inverter 110. In an example, the switch 105 can be configured to receive $V_{BAT}$ from a battery supply, to receive $V_{USB}$ from an external supply, and to provide an internal device voltage ($V_{DD}$). The switch 105 can include first and second transistors 145, 150, and $V_{DD}$ can be provided using at least one of the first transistor 145 and $V_{BAT}$ or the second transistor 150 and $V_{BUS}$.

In an example, under normal operation the switch 105 can default to providing $V_{DD}$ using $V_{BAT}$ when $V_{BAT}$ is present, or when $V_{BAT}$ is present and above a threshold (e.g., a level sufficient to create an internal device voltage, such as 2.4V, etc.), and using $V_{USB}$ when the $V_{BAT}$ is not present, or when $V_{BAT}$ is present but below the threshold.

In an example, that a PSO can be configured to override one or more conditions with respect to $V_{BUS}$ and $V_{BAT}$, e.g., manually or according to one or more conditions. For example, if the PSO option is selected, such as by a user, the first and second switches 110, 111 can change states, and the switch 105 can then default to providing $V_{DD}$ using $V_{BUS}$ when $V_{USB}$ is present, when $V_{USB}$ is present and above a threshold, or when $V_{BUS}$ is present and greater than $V_{BAT}$, and using $V_{BAT}$ when $V_{BUS}$ is not present, when $V_{BUS}$ is present but below the threshold, or when $V_{BUS}$ is present but less than $V_{BAT}$.

Figure 3:
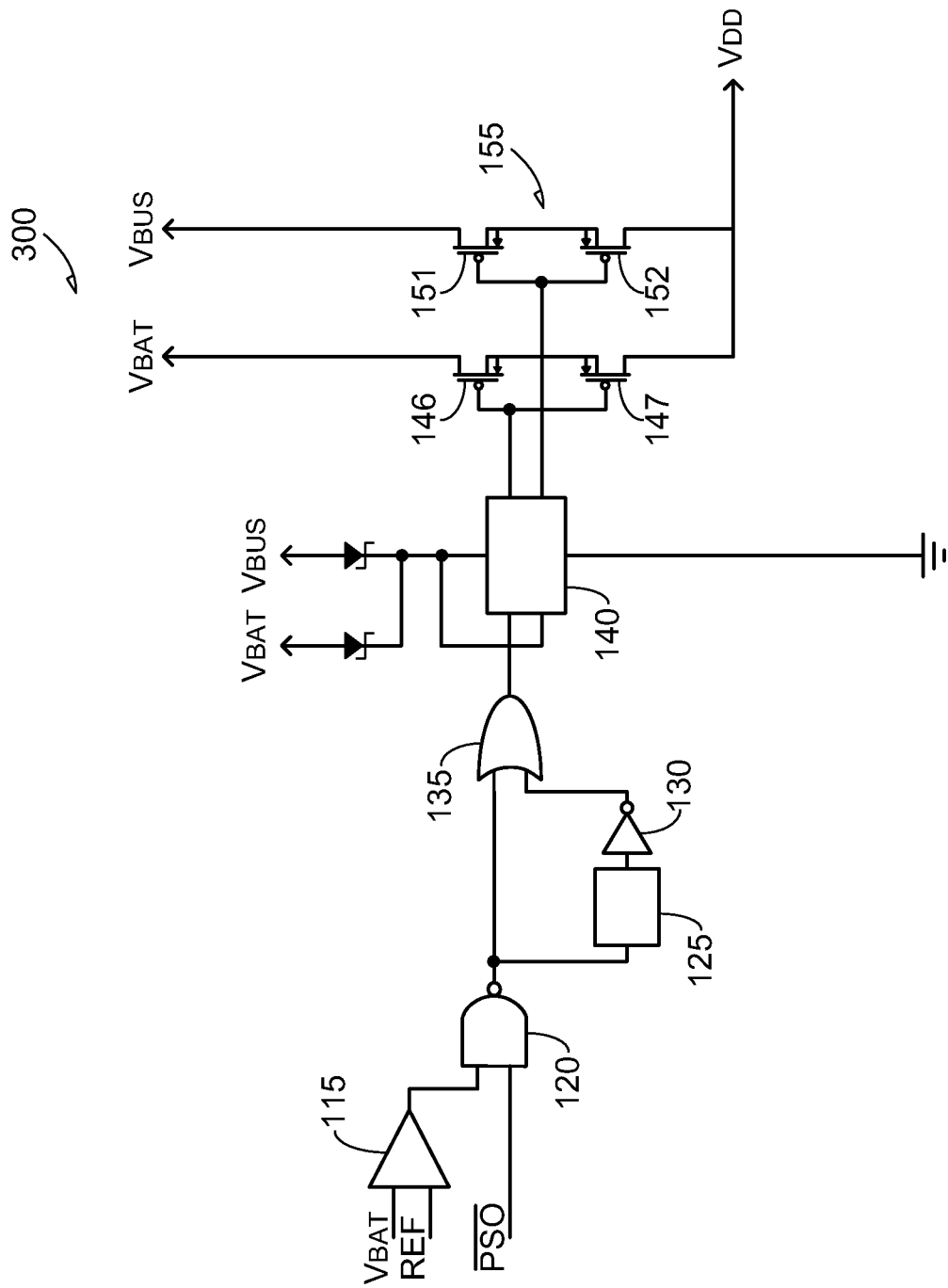

FIG. 3 illustrates generally an example of a system 300 including a comparator 115, a logic gate 120, and a switched power supply 155. In an example, the comparator 115 can be configured to determine if $V_{BAT}$ is valid, such as by comparing $V_{BAT}$ to a reference (e.g., a threshold, such as 2.4V, etc.). In the example of FIG. 3, the logic gate 120 can include a NOR gate configured to receive the output from the comparator 115 and an active low power supply override (PSO) signal.

In certain examples, the system 300 can include glitch elimination circuit configured to eliminate temporary glitches arising from momentary, but not permanent state changes in the system 300. In an example, the glitch elimination circuit can include a delay circuit 125, an inverter 130, and a logic gate 135. In an example, the glitch elimination circuit can be configured to receive the output from the logic gate 120 and remove temporary state changes within said output. The amount of delay introduced by the delay circuit 125 can change the length of the glitch eliminated by the glitch elimination circuit.

In an example, the system 300 can include a break before make circuit 140 configured to ensure that $V_{BAT}$, or a battery supply, and $V_{BUS}$, or an external supply, are not inadvertently connected to each other, such as during switching.

In an example, the switched power supply 155 can include first, second, third, and fourth switching transistors 146, 147, 151, 152, the first and second switching transistors 146, 147 configured to provide an internal device voltage ($V_{DD}$) using $V_{BAT}$, and the third and fourth switching transistors 151, 152 configured to provide $V_{DD}$ using $V_{BUS}$. In an example, the first, second, third, and fourth switching transistors can include p-type metal oxide semiconductor field effect transistors (MOSFETs). In other examples, the switched power supply 155 can include one or more other types or combinations of transistors.

In an example, the break before make circuit 140 can be configured to receive the determination that $V_{BAT}$ is valid and provide one or more enable signals to the switched power supply 155. The switched power supply 155 can provide $V_{DD}$ using at least one of $V_{BAT}$ or $V_{BUS}$, depending on the one or more enable signals.

Figure 4:
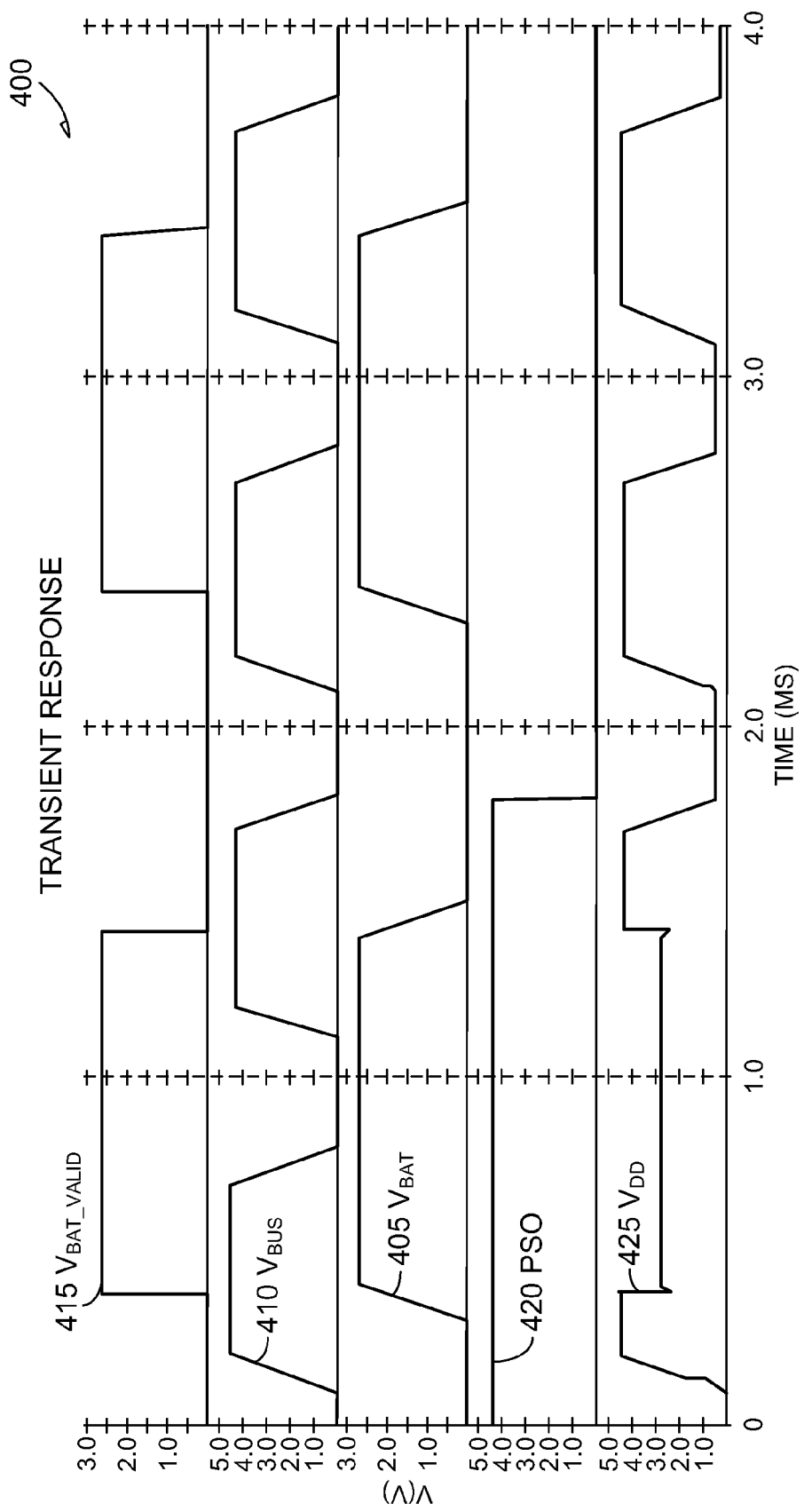
FIG. 4 illustrates generally an example of a relationship between a battery supply voltage, ($V_{BAT}$), an external supply voltage ($V_{BUS}$), a power supply override (PSO) signal, and an internal device voltage ($V_{DD}$).

FIG. 4 illustrates generally an example of a relationship 400 between a battery supply voltage ($V_{BAT}$), an external supply voltage ($V_{BUS}$), a power supply override (PSO) signal, and an internal device voltage ($V_{DD}$), such as according to the example illustrated in system 300 of FIG. 3. In other examples, one or more other relationships can be obtained, depending on variance in the example circuits disclosed above.

Additional Notes and Examples

In Example 1, a system can include a switch circuit configured to receive a battery supply voltage, to receive an external supply voltage, and to provide an internal device voltage, the switch circuit including a comparator configured to determine if the battery supply voltage is valid, wherein the switch circuit is configured to default to providing the internal device voltage using the battery supply voltage if the battery supply voltage is valid.

In Example 2, the switch circuit of Example 1 is optionally configured to receive information from the comparator and to provide the internal device voltage using the battery supply voltage when the information from the comparator indicates that the battery supply voltage is above the reference.

In Example 3, a system can include a switch circuit configured to receive a battery supply voltage, to receive an external supply voltage, and to provide an internal device voltage, the switch circuit including a comparator configured to determine if the battery supply voltage is valid and a power supply override circuit configured to receive information about a supply voltage selection, wherein the switch circuit is configured to default to providing the internal device voltage using the battery supply voltage if the battery supply voltage is valid and the information about the supply preference indicates that the battery supply voltage is selected, and wherein the switch circuit is configured to default to providing the internal device voltage using the external supply voltage if the information about the supply preference indicates that the external supply voltage is selected.

In Example 4, the switch circuit of any one or more of Examples 1-3 is optionally configured to provide the internal device voltage using the external supply voltage if the battery supply voltage is invalid.

In Example 5, the comparator of any one or more of Examples 1-4 is optionally configured to receive the battery supply voltage and to compare the battery supply voltage to a reference.

In Example 6, the switch circuit of any one or more of Examples 1-5 is optionally configured to receive information from the comparator and to provide the internal device voltage using the battery supply voltage when the information from the comparator indicates that the battery supply voltage is above the reference.

In Example 7, the switch circuit of any one or more of Examples 1-6 is optionally configured to receive information from the comparator and to provide the internal device voltage using the battery supply voltage when the information from the comparator indicates that the battery supply voltage is above the reference and the information about the supply preference indicates that the battery supply voltage is selected.

In Example 8, any one or more of Examples 1-7 optionally includes a mobile device configured to be coupled to an internal battery and an external supply, wherein the battery supply voltage includes voltage from the internal battery, wherein the external supply voltage includes voltage from the external supply, and wherein the internal device voltage is configured to power the mobile device.

In Example 9, the external supply of any one or more of Examples 1-8 optionally includes a universal serial bus (USB) supply configured to be coupled to the mobile device using a USB port.

In Example 10, a method can include receiving a battery supply voltage, receiving an external supply voltage, determining if the battery supply voltage is valid, and providing, by default, an internal device voltage using the battery supply voltage if the battery supply voltage is valid.

In Example 11, the determining if the battery supply voltage is valid of any one or more of Examples 1-10 optionally includes comparing the battery supply voltage to a reference.

In Example 12, the providing the internal device voltage using the battery supply voltage of any one or more of Examples 1-11 optionally includes when the information from the comparator indicates that the battery supply voltage is above the reference.

In Example 13, a method can include receiving a battery supply voltage, receiving an external supply voltage, determining if the battery supply voltage is valid, receiving information about a supply voltage selection, providing an internal device voltage using the battery supply voltage if the battery supply voltage is valid and the information about the supply preference indicates that the battery supply voltage is selected, and providing the internal device voltage using the external supply voltage if the information about the supply preference indicates that the external supply voltage is selected.

In Example 14, any one or more of Examples 1-13 can optionally provide the internal device voltage using the external supply voltage if the battery supply voltage is invalid.

In Example 15, the determining if the battery supply voltage is valid of any one or more of Examples 1-14 optionally includes comparing the battery supply voltage to a reference, wherein the providing the internal device voltage using the battery supply voltage includes when the information from the comparator indicates that the battery supply voltage is above the reference.

In Example 20, the receiving the battery supply voltage of any one or more of Examples 1-19 optionally includes from an internal battery of a mobile device, the receiving the external supply voltage of any one or more of Examples 1-19 optionally includes from an external supply of the mobile device, and any one or more of Examples 1-19 optionally includes powering at least a portion of the mobile device using the internal device voltage.

In Example 21, a system or apparatus can include, or can optionally be combined with any portion or combination of any portions of any one or more of Examples 1-20 to include, means for performing any one or more of the functions of Examples 1-20, or a machine-readable medium including instructions that, when performed by a machine, cause the machine to perform any one or more of the functions of Examples 1-20.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, although the examples above have been described relating to p-type devices, one or more examples can be applicable to n-type devices. In other examples, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A system, comprising:
   a USB switch circuit configured to receive a battery supply voltage, to receive a USB bus voltage, and to provide an internal device voltage for the USB switch circuit, the USB switch circuit including:
   a comparator configured to determine if the battery supply voltage is valid; and
   a power supply override circuit configured to receive an override selection; and
   wherein, in normal operation, when the power supply override circuit does not receive the override selection, the USB switch circuit is configured to provide the internal device voltage using only the battery supply voltage if the battery supply voltage is valid and the USB bus voltage is valid, and using only the USB bus voltage if the battery supply voltage is invalid; and wherein, in override operation, when the power supply override circuit receives the override selection, the USB switch circuit is configured to provide the internal device voltage using only the USB bus voltage if the USB bus voltage is valid.

2. The system of claim 1, wherein the comparator is configured to compare the battery supply voltage to a reference.

3. The system of claim 2, wherein, in normal operation, when the power supply override circuit does not receive the override selection, the USB switch circuit is configured to receive information from the comparator and to provide the internal device voltage using the battery supply voltage when the information from the comparator indicates that the battery supply voltage is above the reference.

4. The system of claim 1, wherein the system includes a mobile device configured to be coupled to an internal battery, wherein the battery supply voltage includes voltage from the internal battery, wherein the USB bus voltage includes voltage from an AC-to-DC converter coupled to a USB port of the mobile device.

5. The system of claim 1, wherein, in override operation, when the power supply override circuit receives the override selection, the switch circuit is configured to provide the internal device voltage using only the battery supply voltage if the USB bus voltage is invalid.

6. A method, comprising:

receiving a battery supply voltage at a first input of a USB switch circuit;

receiving a USB bus voltage at a second input of the USB switch circuit;

determining if the battery supply voltage is valid; and receiving information about a supply override selection;

providing, in normal operation, when a supply override selection has not been received, an internal device voltage for the USB switch circuit using only the battery supply voltage if the battery supply voltage is valid and the USB bus voltage is valid, and using only the USB bus voltage if the battery supply voltage is invalid; and providing, in override operation, when a supply override selection has been received, the internal device voltage for the USB switch circuit using only the USB bus voltage if the USB bus voltage is valid.

7. The method of claim 6, wherein the determining if the battery supply voltage is valid includes comparing the battery supply voltage to a reference.

8. The method of claim 7, wherein the providing the internal device voltage using the battery supply voltage includes when the information from the comparator indicates that the battery supply voltage is above the reference.

9. The method of claim 6, wherein the receiving the battery supply voltage includes from an internal battery of a mobile device; and wherein the receiving the USB bus voltage includes from an AC-to-DC converter coupled to a USB port of the mobile device.

10. The method of claim 6, including:

providing, in override operation, when the supply override selection has been received, the internal device voltage for the USB switch circuit using only the battery supply voltage if the USB bus voltage is invalid.

* * * * *